United States Patent [19]

Schlotterer et al.

[11] Patent Number: 5,023,822
[45] Date of Patent: Jun. 11, 1991

[54] PULSE RATIO SYSTEM

[76] Inventors: John C. Schlotterer, 3479 Ivy La., Murrysville, Pa. 15668; Paul M. Johnston, 8900 Brookstone Ct., Raleigh, N.C. 27611; Mark F. Rusnak, P.O. Box 625, Irwin, Pa. 15642; Lawrence T. Pillage, 405 Smokey Wood Dr., Pittsburgh, Pa. 15218; Thomas M. Byrd, Jr., 903 Washington St., Cary, N.C. 27511

[21] Appl. No.: 264,582

[22] Filed: Oct. 31, 1988

[51] Int. Cl.⁵ ............ G06F 15/20; G06F 15/22; G06F 7/68
[52] U.S. Cl. .................... 364/703; 364/464; 364/04; 364/565; 377/47
[58] Field of Search ............ 364/464.04, 703, 565; 377/47; 318/570

[56] References Cited

U.S. PATENT DOCUMENTS

| | | | |
|---|---|---|---|
| 3,760,170 | 9/1973 | Weber et al. | 318/570 |
| 3,828,169 | 8/1974 | Fluet | 364/703 |
| 3,916,175 | 10/1975 | Lauer et al. | 364/703 |
| 3,943,341 | 3/1976 | Corsi et al. | 364/703 X |
| 4,244,027 | 1/1981 | Shai | 364/703 |
| 4,261,037 | 4/1981 | Hicks | 364/464.04 |
| 4,310,801 | 1/1982 | Baker | 364/703 X |
| 4,349,887 | 9/1982 | Crowley | 364/703 |
| 4,399,510 | 8/1983 | Hicks | 364/464.04 |
| 4,413,350 | 11/1983 | Bond et al. | 364/703 X |
| 4,506,339 | 3/1985 | Kühnlein | 364/565 |
| 4,773,031 | 9/1988 | Tobin | 364/703 |
| 4,839,834 | 6/1989 | Omae et al. | 364/565 |

FOREIGN PATENT DOCUMENTS

| | | | |
|---|---|---|---|
| 57-24862 | 2/1982 | Japan | 364/464.04 |
| 57-53666 | 3/1982 | Japan | 364/464.04 |

*Primary Examiner*—Felix D. Gruber
*Attorney, Agent, or Firm*—Staas & Halsey

[57] ABSTRACT

A programmable system for providing a programmable ratio of output pulses to input pulses. The programmable system receives pulses from an electric power meter and outputs a programmable number of pulses representing a number of kilowatt hours consumed. Various electric power meter disk patterns can be processed by the programmable system. The programmable ratio can be applied via input pins and/or via an external memory.

6 Claims, 8 Drawing Sheets

FIG. 5A

| N8 | N7 | N6 | N5 | N4 | N3 | N2 | N1 | $M_p$ |
|----|----|----|----|----|----|----|----|-------|
| H | H | H | H | H | H | H | L | m/1 |
| H | H | H | H | H | H | L | H | m/2 |
| H | H | H | H | H | H | L | H | m/3 |
| H | H | H | H | H | L | H | H | m/4 |
| H | H | H | H | H | L | H | H | m/5 |
| H | H | H | H | L | H | H | H | m/8 |
| H | H | H | L | H | H | H | H | m/16 |
| H | H | L | H | H | H | H | H | m/32 |
| H | L | H | H | H | H | H | H | m/64 |
| L | H | H | H | H | H | H | H | m/128 |
| L | L | L | L | L | L | L | L | m/255 |
| H | H | H | H | H | H | H | H | m/256 |

FIG. 5B

| M10 | M9 | M8 | M7 | M6 | M5 | M4 | M3 | M2 | M1 | $M_p$ |
|-----|----|----|----|----|----|----|----|----|----|-------|
| H | H | H | H | H | H | H | H | H | L | 1/n |
| H | H | H | H | H | H | H | H | L | H | 2/n |
| H | H | H | H | H | H | H | H | L | H | 3/n |
| H | H | H | H | H | H | H | L | H | H | 4/n |
| H | H | H | H | H | H | H | L | H | H | 5/n |
| H | H | H | H | H | H | L | H | H | H | 8/n |
| H | H | H | H | H | L | H | H | H | H | 16/n |
| H | H | H | H | L | H | H | H | H | H | 32/n |
| H | H | H | L | H | H | H | H | H | H | 64/n |
| H | H | L | H | H | H | H | H | H | H | 128/n |
| H | L | H | H | H | H | H | H | H | H | 256/n |
| L | H | H | H | H | H | H | H | H | H | 512/n |
| L | L | L | L | L | L | L | L | L | L | 1023/n |
| H | H | H | H | H | H | H | H | H | H | 1024/n |

FIG.10A

| N2N | N1N | FRN | RRN |
|---|---|---|---|
| 0 | 0 | BF | BR |
| 0 | 1 | PRDONE | DONE |
| 1 | 0 | FOVER | ROVER |
| 1 | 1 | FE | RE |

FIG.10B

| N4N | N3N | N2N | N1N | TOK | FWD |
|---|---|---|---|---|---|
| X | X | 0 | 0 | RREQ | FREQ |
| X | X | 0 | 1 | PREV | PFWD |
| 0 | X | 1 | 0 | IPERR | CHECK OK |
| 1 | 0 | 1 | 0 | IPERR | −ONE |
| 1 | 1 | 1 | 0 | IPERR | −ZERO |
| X | X | 1 | 1 | MERR | QERR |

PULSE RATIO SYSTEM

BACKGROUND OF THE INVENTION

The present invention is related to electrical power meters, and more particularly, to an integrated circuit that simplifies the mechanical portions of an electric power meter.

In an electric power meter, a mechanical gear train is driven by a meter disk. Various customers of electric power meters required that the gear train have various customized ratios between the number of meter disk rotations and the output of the gear train. As a result, various electrical power meters require different mechanical gear trains to provide the customized ratio. This increases the cost of electric power meters as well as the time required to manufacture electric power meters for a given customer.

SUMMARY OF THE INVENTION

It is an object of the present invention to provide an electronic replacement for a mechanical gear train used in electric power meters.

It is another object of the present invention to provide a programmable system capable of providing a selectable ratio of output pulses to a number of rotations of a meter disk of an electric power meter.

It is a further object of the present invention to provide a system for generating output pulses proportional to a programmable number of kilowatt hours consumed.

It is still a further object of the present invention provide a system for generating output pulses for forward and reverse rotation of an electronic power meter disk.

It is still another object of the present invention to provide a system for generating an output pulse for various patterns on an electric power meter disk.

To achieve the above and other objects, the present invention includes pulse receiver means for receiving pulses, for detecting a direction of rotating a meter disk and for providing motion signals in dependence upon the detecting; register means for receiving control parameters, for storing the control parameters and for providing a plurality of parameter outputs responsive to the control parameters; ratio means for receiving the motion signals and for providing ratio signals responsive to the motion signals and to a ratio of a first group of the parameter outputs to a second group of the parameter outputs; and output means for providing output drive signals responsive to the ratio signals and in accordance with a third group of the parameter outputs and the direction of rotation detected by the pulse receiving means.

BRIEF DESCRIPTION OF THE DRAWINGS

FIGS. 5A and 5B illustrate the functional characteristic assigned to portions of the systems shown in FIG. 1;

FIGS. 10A and 10B illustrate the various signals testable during testing of the FIG. 1 system.

DESCRIPTION OF THE PREFERRED EMBODIMENT

Figure 1:
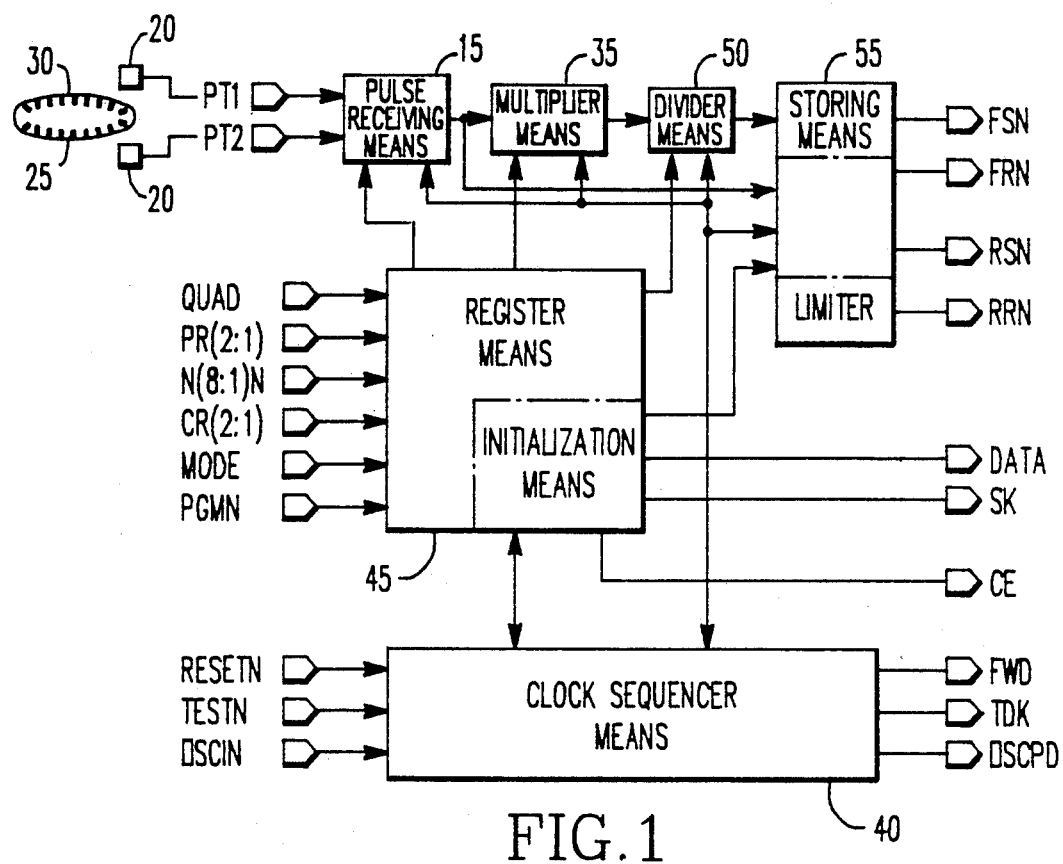
FIG. 1 is a block diagram of a circuit embodying the present invention.

FIG. 1 is a block diagram of a circuit embodying the present invention. In FIG. 1 reference numeral 15 identifies a pulse receiving means. The pulse receiving means 15 receives pulses on signal lines PT1 and PT2. The pulses can be generated by, for example, photodiodes 20 detecting a pattern 25 on a rotatable disk 30. The rotatable disk 30 can be, for example, a meter disk that is typically housed within an electric power meter (not shown).

In a preferred embodiment of the present invention, the pattern 25 can be either a quadrature pattern or a single track pattern. In a quadrature pattern, two tracks are positioned so that pulses generated by the photodiodes 20 are 90° out of phase with respect to each other. This two track quadrature scheme provides meter disk rotation information.

Figure 2:
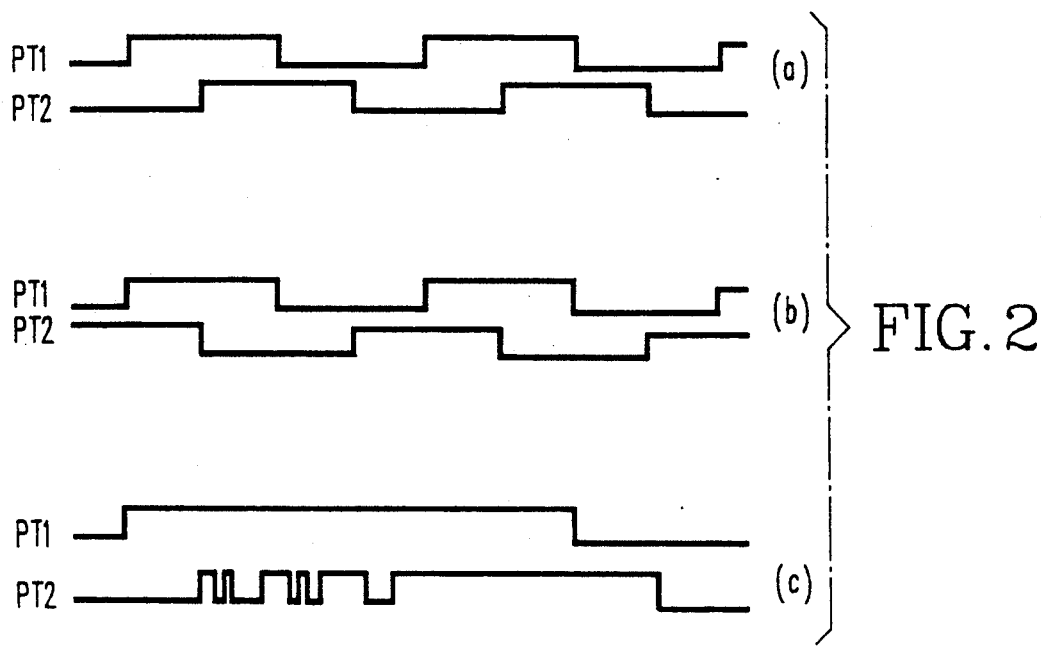
FIG. 2 is a timing diagram illustrating a portion of the timing used in the FIG. 1 system.

Referring to FIG. 2, waveform A illustrates the timing of the pulse signals PT1 and PT2 generated during forward rotation of the disk. In waveform B of FIG. 2, pulses PT1 lag 90° behind pulses PT2; thus, indicating reverse rotation of the disk. In addition, the quadrature pattern enables disk "hunting" to be detected. This is because valid rotation requires the movement of at least two disk positions in the same direction, such as shown in FIG. 2, waveforms A and B. FIG. 2 waveform C illustrates a situation of disk hunting wherein only one pulse PT1 is generated while many PT2 pulses (due to hunting) are generated.

The pulse receiving means 15 periodically samples the pulses received on the inputs PT1 and PT2, and determines whether the disk 30 is rotating in the forward direction or reverse direction, based upon the received pulses having waveforms such as shown in FIG. 2.

Figure 3:
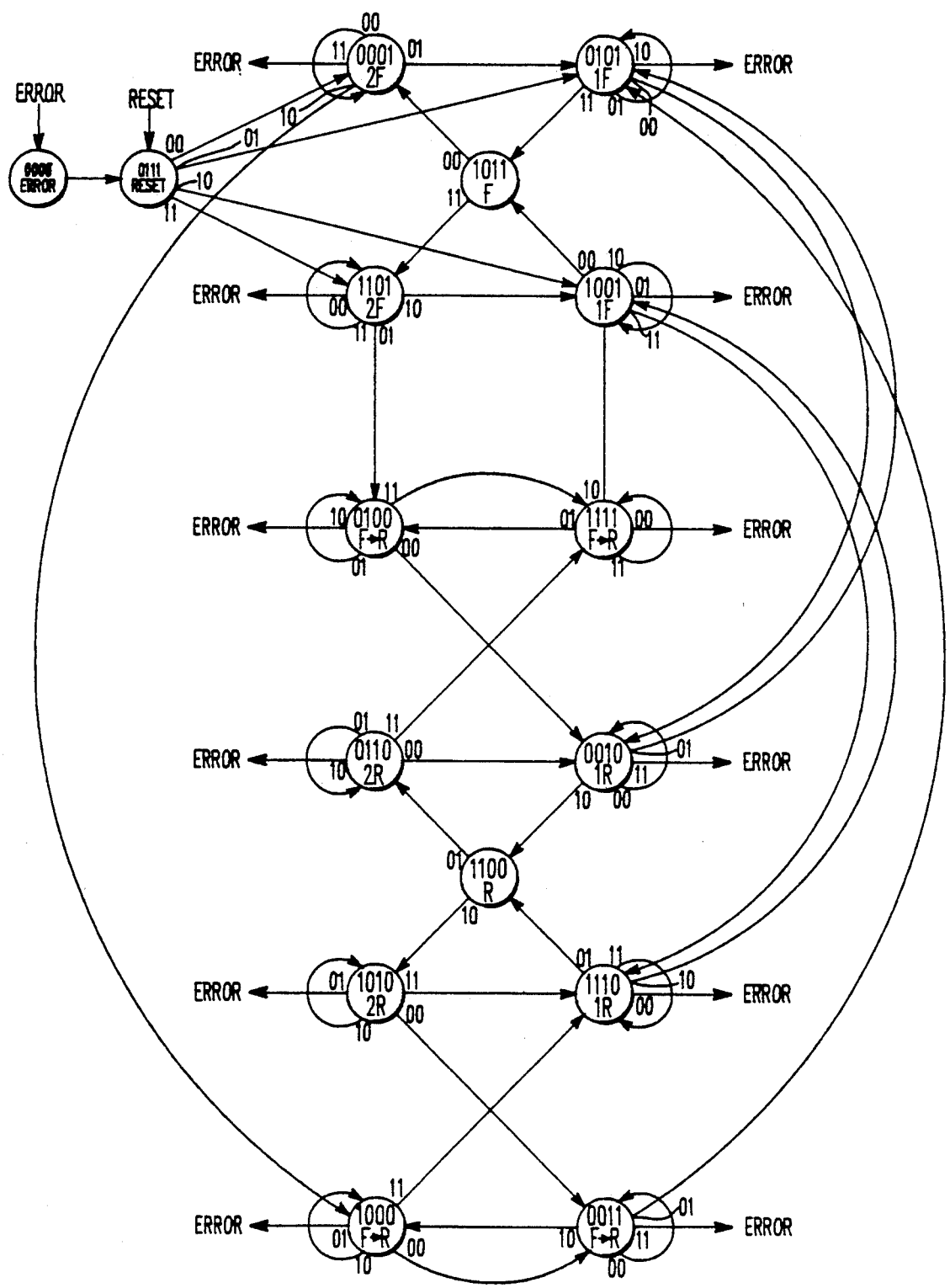
FIG. 3 is a state transition diagram of an input portion of the FIG. 1 system.
Figures 4, 6A, 6B:
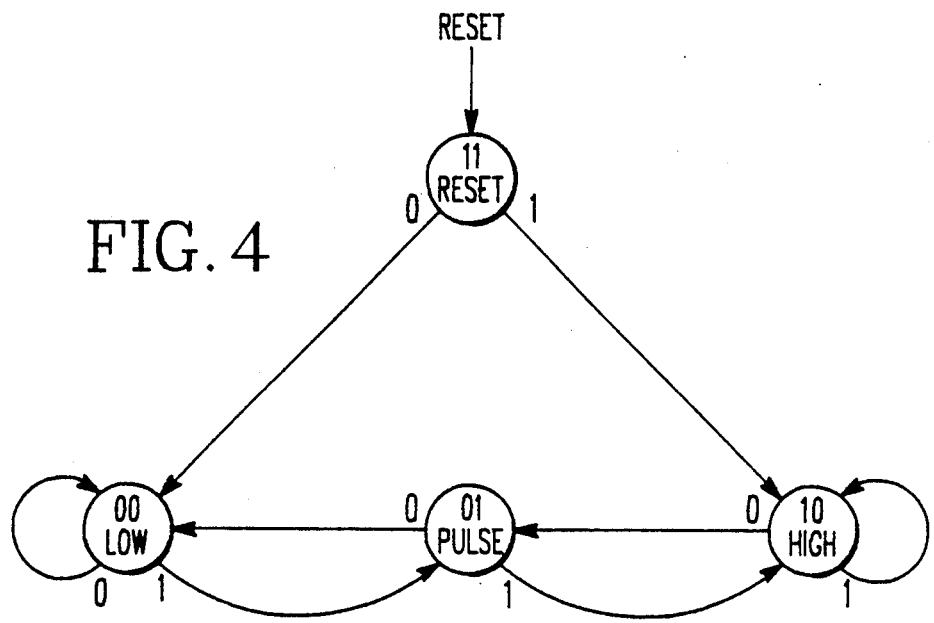
FIG. 4 is a state transition diagram representing pulse detection.
FIGS. 6A and 6B illustrate various functional characteristics assigned to logic inputs to another portion of the system shown in FIG. 1.

FIG. 3 is a state transition diagram illustrating the processing performed by the pulse receiving means 15 on the received quadrature pulses PT1 and PT2. Essentially, for processing of a quadrature pattern, the pulse receiving means is sixteen states. In FIG. 3 the numerals associated with each of the arrows respectively correspond to the logical states of the lines PT1 and PT2. The numerals within in each circle identify the state number. The designation underneath each state number identifies the rotational direction. As noted above, two pulses in the same direction are required for valid pulse detection. FIG. 4 is a state transition diagram of the operations/processing performed on one of two identical patterns (25) on the meter disk 30. Referring to FIG. 4, when the FIG. 1 system is reset, the system samples the input pulses. If a one is detected, then the system moves to a HIGH state. If, however, a zero is detected, then the system moves to a LOW state. The system remains in either the LOW or HIGH state until a one (in the LOW state) or a zero (in the HIGH state) is received. This moves the system to a PULSE state. The system then moves between the LOW, PULSE and HIGH states depending upon the input pulse logic level, as shown in FIG. 4.

As a result of the processing illustrated in FIG. 3, the pulse receiving means 15 outputs motion signals to a multiplier means 35. The motion signals comprise a first series of pulses for meter disk rotation in a forward direction, and a second series of pulses for meter disk rotation in a reverse direction.

If the FIG. 1 system is not detecting quadrature pulses, then the two signals (PT1, PT2) are independent, unrelated signals and are processed in accordance with the FIG. 4 processing. These signals do not even have to originate from the same meter disk 30.

The multiplier means 35 includes two identical multipliers, one for the first series of pulses, and one for the second series of pulses. In a preferred embodiment of the present invention, each of the multipliers comprises a synchronized 8-bit downcounter and a single control flip-flop. The counter is clocked by a master clock provided by a clock sequencer means 40. The multiplier means 35 is either loaded with an N bit multiplier, or counts down, depending on the state of the control flip-flop. When a motion signal (e.g. a pulse) is received from the pulse receiving means 15, the control flip-flop state is changed from the load state to the count state. The control flip-flop remains in the count state until the 8-bit downcounter reaches a value of "00000001." Upon reaching this state, the control flip-flop is reset, causing the counter to be placed in the load state. The result of this operation causes the multiplier means 35 to provide N-pulses for each pulse received from the pulse receiving means 15. The N-pulses are provided by the multiplier means, as multiplier signals. Because there are two independent multipliers within the multiplier means 35, N pulses are independently provided for each pulse in the first series of pulses and for each pulse in the second series of pulses.

FIG. 5a illustrates a first group of parameters outputs corresponding the multiplier received by the multiplier means 35 from the register means 45. The register means 45 can receive 8-bits of control parameter information on the N<8:1>N lines, or can receive this information from an external (e.g. non-volatile) memory as discussed below. These eight inputs define the multiplier applied to the multiplier means 35.

The multiplier signals provided by the multiplier means 35 are applied to a divider means 50. As with the multiplier means 35, the divider means 50 includes two independent dividers, one for the multiplier signals generated by the multiplier means 35 in response to a pulse indicating forward rotation received from the pulse receiving means 15; and a divider for multiplier signals generated in response to a pulse indicating reverse direction rotation received from the pulse receiving means 15. Because the dividers have identical structures, the following refers to only one divider. The divider comprises a set of variable ratio counters. A first counter divides the multiplier signal in accordance with a first divisor received from the register means 45. The second counter receives a second divisor from the register means 45, and divides the output of a first divider by this second divisor. The second divisor corresponds to the number of cycles in the pattern on the disk 30; and is received by the register means 45 on input terminals CR<2:1>. Since there are a number of encoded cycles in the pattern 25 for each revolution of the meter disk, the second divisor enables that number to be The first divider comprises a 10-bit counter having three modes of operation: a hold mode, a counting mode, and a load mode. The counter is initially loaded with an M bit value corresponding to the first divisor received from the register means 45 on input terminals M<10:1>N or received from the external memory. The counter is reloaded with the M-term value when the counter reaches the state "0000000001." The counter is decremented once for each pulse received from the multiplier means 35. The divider 50, therefore, provides an output pulse once for every M-pulses received from the multiplier means 35. FIG. 6A illustrates values of the second divisor (1, 2, 6, 8) provided to the divider means 50 by the register means 45.

The second counter is a 3-bit counter operating in the same manner as the 10-bit counter. The 3-bit counter divides an input by 1, 2, 6 or 8 depending on the state of the second divisor signals received from the register means 45. The output of the second counter corresponds to a ratio signal generated by the divider means 50. The first and second divisors correspond to a second group of parameter outputs received from the register means 45. As with the multiplier signals generated by the multiplier means 35, the divider means 50 provides two ratio signals, one for each direction of rotation of the meter disk 30.

The divider means 50 provides a number of pulses, $M_p$ as ratio signals. These ratio signals correspond to the motion signals provided by the input processor multiplied by the ratio m/n, where "m" corresponds to the multiplier supplied to the multiplier means by the parameter means 45, and "n" corresponds to the first and second divisors provided to the divider means 50 by the register means 45. The multiplier means 35 and divider means 50 comprise a ratio means that multiplies the motion signals, received from the pulse receiving means 15, by a quantity corresponding to m/(n).

The ratio signals output by the divider means 50 are applied to an output means 55. The output means 55 stores the ratio signals and generates forward (FSN, FRN) and reverse (RSN, RRN) output drive signals based on the received ratio signals and the direction of rotation detected by the pulse receiving means 15. The output drive signals are limited to a predetermined level. For example, the pulse rate of the forward and reverse output drive signals is limited to a maximum number of pulses per time period. Pulse rate configuration signals received by the register means 45 on the terminals PR<2:1> (or from the external memory) define the output pulse rate limit. These signals are supplied to the output means 55 via the register means 45. As with the multiplier means 35 and divider means 50, the output means 55 includes two separate means for limiting the forward output drive signals and the reverse drive signals. Since the structure of each is the same, the following refers to only one. The means for limiting an output drive signal comprises two counter means. The first is a 9-bit pseudo-random counter that is reset when it counts 500 master clock pulses. As noted above, the master clock pulses are provided by the clock sequencer means 40. After counting 500 master clock pulses, the first counter outputs a signal which is counted by a second counter. The second counter receives the pulse rate configuration signals PR1 and PR2 received from the register means 45. As shown in FIG. 6B, the pulse rate configuration signals define a maximum pulse rate for the output drive signal. After counting the appropriate number of counts, the second counter asserts a DONE signal.

The output means has two states, idle and wait. The output means is in the idle state when no ratio signals are received from the divider means 50, and all previously received pulses (i.e., ratio signals) have been output as output drive signals. When a ratio signal is received from the divider means 50, the output means 55 enters the wait state. The output means remains in the wait state until the above-mentioned DONE signal occurs. If a ratio signal is received while the output means 55 is in the wait state, that signal is stored in, for example, a counter. More particularly, ratio signals clock-up an up/down counter. This up/down counter is then clocked down when the output means outputs an output drive signal.

When the above-mentioned DONE signal is output by the second counter, either the next ratio signal is output by the output means 55 as an output drive signal, or if no ratio signal is present, the output means 55 enters the idle state, and waits for a ratio signal.

The register means 45 latches control parameters when the FIG. 1 system is reset; reads data from an external memory; writes the control parameters into the external memory; and supplies control parameters to the multiplier means 35, divider means 50, pulse input means 15 and the output means 55. In FIG. 1, the control parameters correspond to the signals received on the QUAD, PR<2:1>, N<8:1>N, M<10:1>N and CR<2:1> terminals or read from an external (e.g. non-volatile) memory. When the FIG. 1 system is reset (e.g. via a signal received on a RESETN terminal), the register means 45 begins an initialization process. In addition, a signal received on a MODE terminal (FIG. 1) is asserted when the system is reset, then the register means 45 latches the control parameters. More particularly, the register means 45 latches the signals corresponding to QUAD, PR1, PR2, the multiplier for the multiplier means 35, the first and second divisors for the divider means 50. If the signal MODE is not asserted when the system is reset, then the register means 45 reads the control parameters from an external memory, for example, a non-volatile memory. Moreover, if when the system is reset, the MODE signal is asserted and a signal received on a PGMN terminal is asserted, the register means 45 writes the control parameters into the external memory. After the initialization process, the register means 45 provides the control parameters to the multiplier means 35, the divider means 50, and the output means 55. The following discusses the major subsystems of the register means 45, including an initialization controller, a configuration register, a program sequencer, and a read sequencer.

Figure 7:
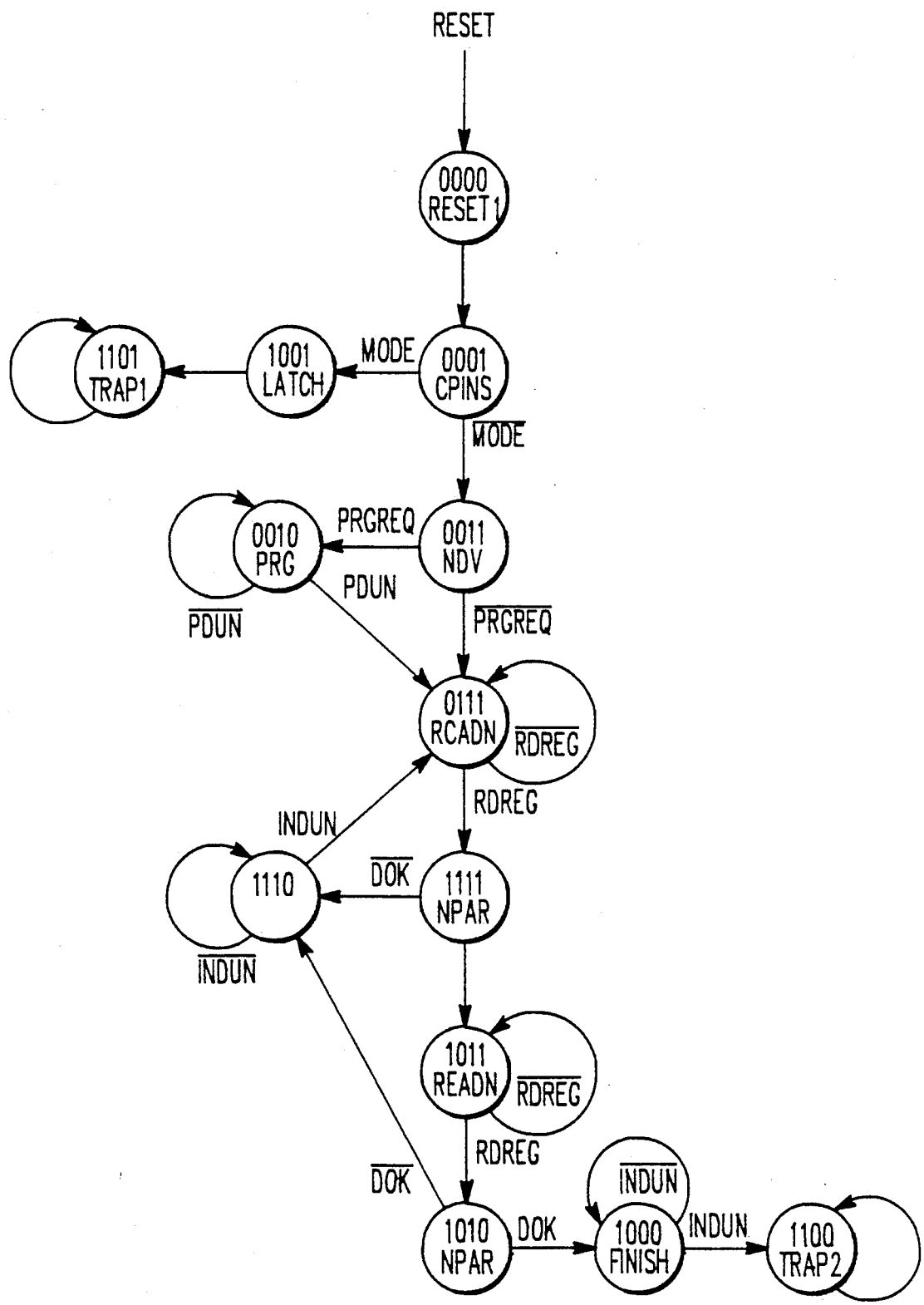
FIG. 7 is a state transition diagram representing initialization of the system shown in FIG. 1.

The register means 45 includes an initialization controller that controls the retrieval and storage of the control parameters. FIG. 7 is a state transition diagram illustrating the processing/operation performed by the initialization controller section of the register means 45. Referring to FIG. 7, a RESET state is entered when the FIG. 1 system is reset. If the signal MODE is asserted, the control parameters are read from the terminals into the register means 45. In this state, the initialization controller then tests if the MODE signal is asserted (state CPINS). If the MODE signal is asserted, the initialization controller branches to a LATCH state, and then into the TRAP1 state where it remains until the system is reset again.

If in the CPINS state, the signal MODE is not asserted, the initialization controller, branches to a NOV state and determines if the signal PGMN is asserted. If the signal PGMN is asserted, then the initialization controller moves into the PRG state. In this state, the initialization controller asserts a signal PROG which is sensed by a program sequencer discussed below. The initialization controller waits in the PRG state until the program sequencer asserts a signal PDUN.

When the signal PDUN is asserted, or if the signal PGMN is not asserted in the NOV state, the initialization controller moves to a READN state. In this state, the initialization controller outputs a signal READ to a read sequencer to be described below. The initialization controller waits in the READN state until the read sequencer issues a signal RDREG which indicates that a first set of control parameters has been read from the external memory. Receipt of the RDREG signal by the initialization controller while in the READN state causes the initialization controller to move to the NPAR state. In the NPAR state, the initialization controller checks to see if there were any errors in reading the first set of control parameters from the external memory; for example, the initialization controller checks the parity of the data read from the external memory. If a parity error is detected, then initialization controller moves to a REDBAD state. In this state, the initialization controller waits for the read sequencer to issue a signal INDUN. Receipt of the signal INDUN by the initialization controller causes the controller to move back to the READN state and again try to read control the first set of parameters from the external memory.

If, while in the NPAR state, the initialization controller confirms that the first set of control parameters was successfully read from the external memory, then the initialization controller moves to A READM state to read a second set of control parameters. Again, the initialization controller waits until the read sequencer issues the signal RDREG, and then moves to an MPAR state. In the MPAR state, the initialization controller determines if the second set of control parameters has been successfully read from the external memory. If an error is detected, then the initialization controller state moves to the REDBAD state as described above. If, however, the second set of control parameters has been successfully read, then the initialization controller moves to the FINISH state. The initialization controller waits in the FINISH state until the read sequencer issues the INDUN signal. Upon receipt of the INDUN signal, the initialization controller moves the TRAP2 state where it waits until the system is again reset.

Figure 8:
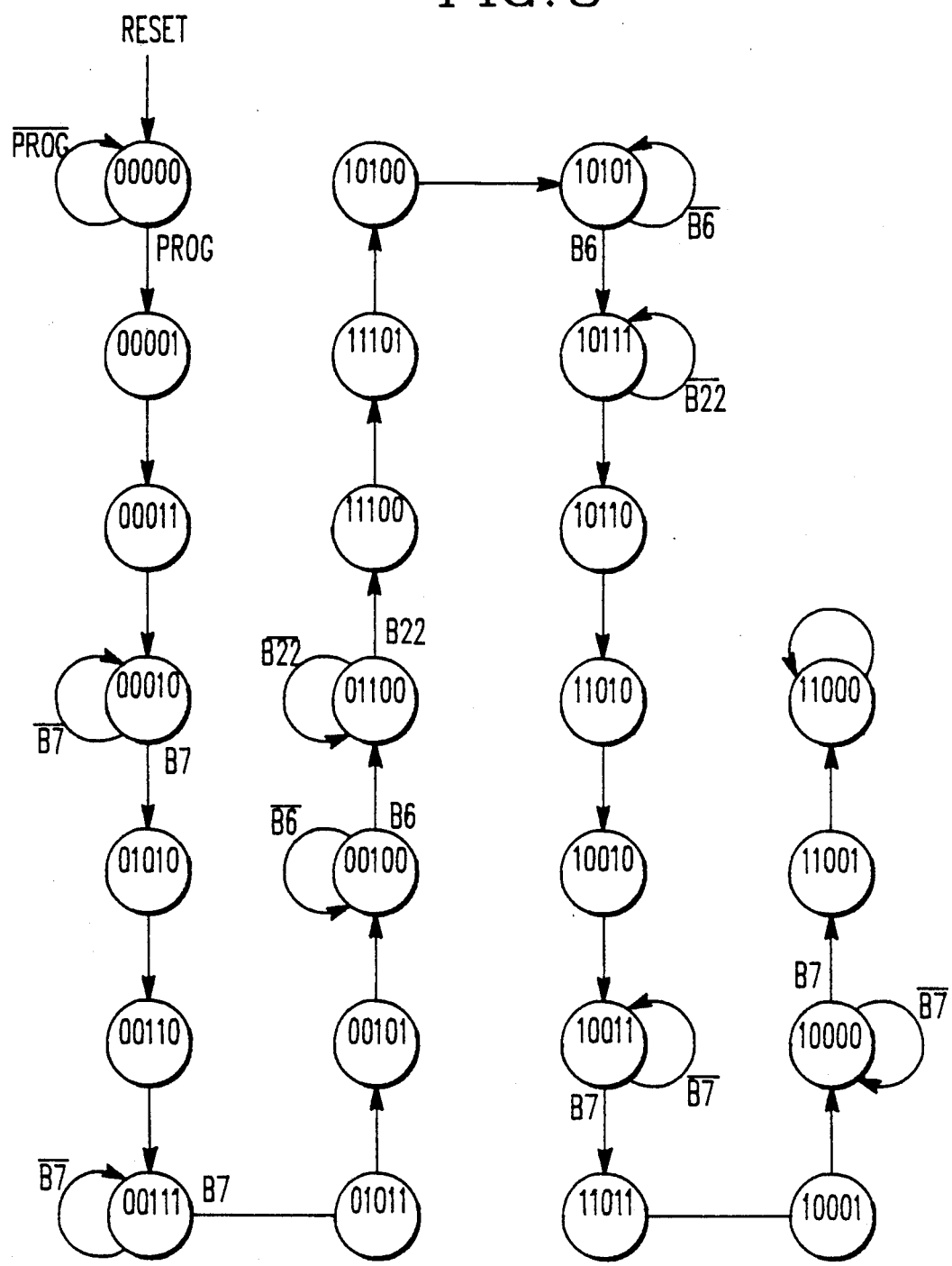
FIG. 8 is a state transition diagram of a portion of the register means shown in FIG. 1.

FIG. 8 is a state transition diagram illustrating processing/operation performed by the program sequencer section of register means 45. The function of the program sequencer is to write the control parameters received by the register mean 45 into the external memory. The processing/operation illustrated in the FIG. 8 state transition diagram is designed to write information into a non-volatile static random access memory manufactured by Xicor, part No. X2444. Other types of external memories could be used. The processing/operation of the program and read sequencers would be adapted to accommodate the particular interface requirements of the desired memory.

Referring to FIG. 8, when the FIG. 1 system is reset, the program sequencer enters a HOLD state. The program sequencer remains in the HOLD state until it receives the PROG signal from the initialization controller as discussed above. Upon the PROG signal, the program sequencer executes the states RCL1, RCL2, and RCL3. These three states read data from the X2444 external memory. While "dummy" there is no valid data to read at this point, this sequence of reads is necessary to enable a "previous recall latch" in the X2444 external memory. This latch must be set before a write operation can be executed. After performing the three "dummy" reads from the external memory, the program sequencer remains in the RCL3 state until it receives a signal B7. In other words, the program sequencer waits a predetermined delay time before continuing to the next state.

After receiving the signal B7, the program sequencer executes the states CEKILL1, WREN1, and WREN2. The state CEKILL1 removes the external memory's chip enable between instructions. This removal is required for proper operation of the X2444 chip. The states WREN1 and WREN2 activate the external memory's write enable latch. The program sequencer waits in the WREN2 state until it receives the signal B7; that is, it waits a predetermined delay time before continuing to the next state.

After receiving the signal B7 in the WREN2 state, the program sequencer executes CEKILL2 state which again removes the X2444's write enable between instructions, and then executes the states NCON1, NCON2, NCON3, and NCON4. These states program the first set of control parameters (i.e., a first word of control parameter) in the external memory. Table 1 illustrates the format of the control parameters stored in the external memory.

moves the chip enable from the X2444 between instructions in state CEKILL5. Following this, the program sequencer executes the states WRDS1 and WRDS2 which disable the write and store operations of the X2444. In state CEKILL6, the program sequencer disables the X2444, and then enters the state TRAP and waits there until the FIG. 1 system is again reset.

Figure 9:
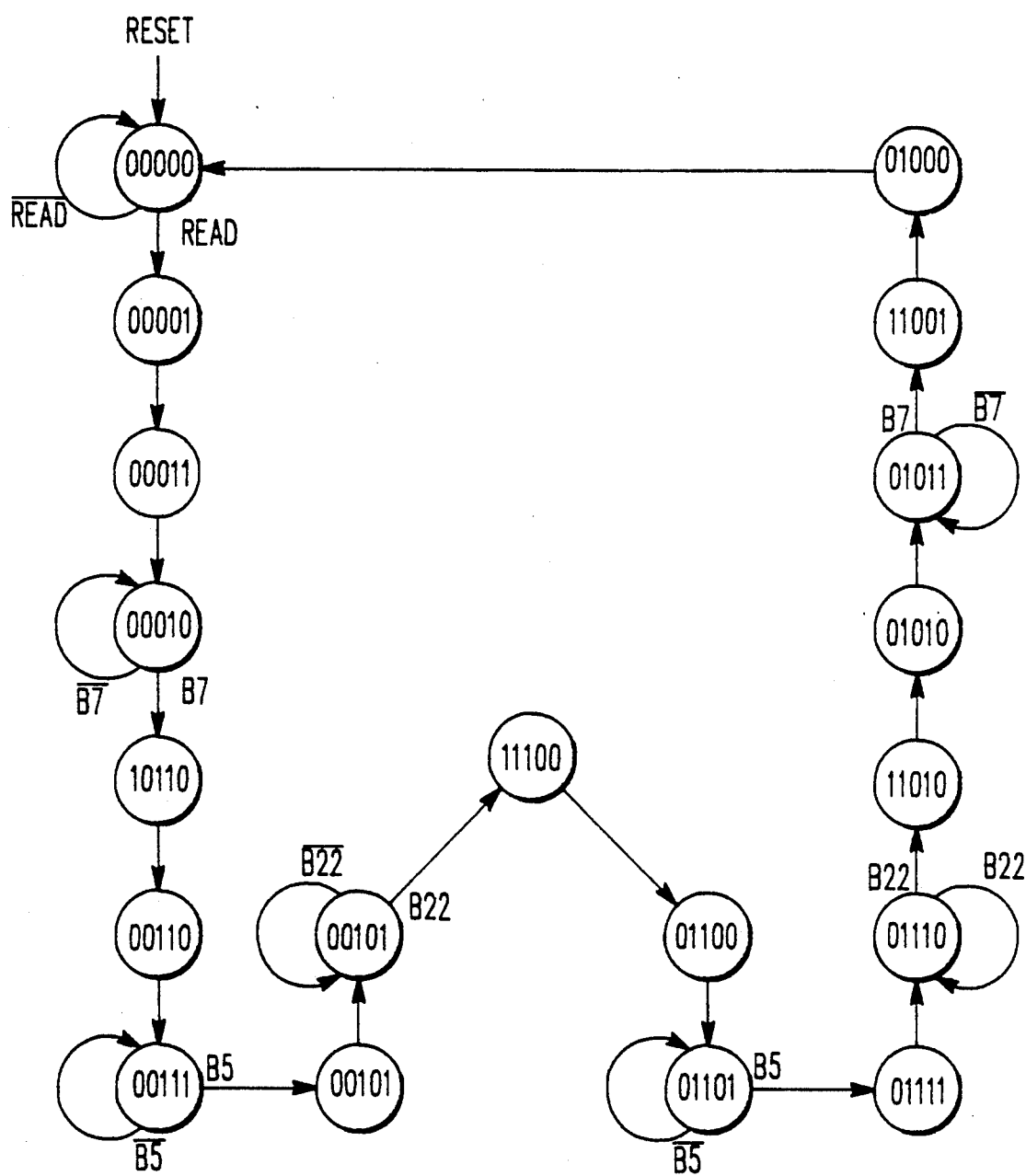
FIG. 9 is a state transition diagram of another portion of the register means shown in FIG. 1.

FIG. 9 is a state transition diagram of the read sequencer portion of the register means 45. The read sequencer functions to read control parameters stored in the external memory and to supply these parameters to the multiplier means 35, divider means 50 and output means 55. As with the program sequencer state transition diagram shown in FIG. 8, the state transition shown in FIG. 9 is particular to the X2444 external memory. Any common external memory could be used by simply modifying the state transition diagram/processing performed in accordance with the interface requirements of desired memory chip. Since the read sequencer is accessing the X2444 for read operations, many of the states/processing are similar to those illustrated in FIG. 8.

Referring to FIG. 9, when the FIG. 1 system is reset, the read sequencer enters a HOLD state and remains there until it receives a signal READ from the initialization controller as discussed above. Upon receiving the signal READ, the read sequencer executes the states RCL1, RCL2 and RCL3. After executing these reads the non-volatile memory is in a state to provide data (i.e. control parameters) to the FIG. 1 system, and the read sequencer executes the state KILLCE1, which removes the X2444's chip enable. As discussed with respect to the program sequencer, this is necessary for valid operation of the X2444.

TABLE 1

ADDRESS 0000:

| $D_{15}$ | $D_{14}$ | $D_{13}$ | $D_{12}$ | $D_{11}$ | $D_{10}$ | $D_9$ | $D_8$ | $D_7$ | $D_6$ | $D_5$ | $D_4$ | $D_3$ | $D_2$ | $D_1$ | $D_0$ |
|---|---|---|---|---|---|---|---|---|---|---|---|---|---|---|---|
| | 0 | | | 1 | 0 | 0 | 0 | N8 | N7 | N6 | N5 | N4 | N3 | N2 | N1 |

└─ PR1/
└─ PR2/
└─ odd parity check bit

ADDRESS 0001:

| $D_{15}$ | $D_{14}$ | $D_{13}$ | $D_{12}$ | $D_{11}$ | $D_{10}$ | $D_9$ | $D_8$ | $D_7$ | $D_6$ | $D_5$ | $D_4$ | $D_3$ | $D_2$ | $D_1$ | $D_0$ |
|---|---|---|---|---|---|---|---|---|---|---|---|---|---|---|---|
| | | | | 0 | 1 | M10 | M9 | M8 | M7 | M6 | M5 | M4 | M3 | M2 | M1 |

└─ QUAD/
└─ CR1/
└─ CR2/
└─ odd parity check bit

After writing the first set of control parameters into the first address, the program sequencer executes the CEKILL3 state which again removes the chip enable between instructions is required to properly operate the X2444. The program sequencer then executes the states MCON1, MCON2, MCON3 and MCON4, so as to write the second set of control parameters into the second address of the external memory.

Next, the program sequencer again removes the X2444's chip enable between instructions in the state CEKILL4. The program sequencer then executes the instructions needed to store the data written in a RAM portion of X2444, in an electrically erasable and programmable read-only memory (EEPROM) portion of the X2444. The instructions/waveforms needed to accomplish to the store function are executed in states STO1 and ST02. After storing the control parameters into the EEPROM, the program sequencer again re- The read sequencer then executes the states NCON1, NCON2, NCON3 and NCON4. These states perform the processing necessary to read the first set of control parameters from the external memory. After removing the X2444's chip enable in a KILLCE2 state, the read sequencer performs the processing to read the second set of control parameters via states MCON1, MCON2, MCON3, and MCON4. After disabling the external memory in a state KILLCE3, the read sequencer issues a "sleep" command to the X2444. This is followed by disabling the external memory in the KILLCE4 state. The read sequencer then asserts the signal IDUN to the initialization controller as discussed above, and then enters the HOLD state where it waits for the FIG. 1 system to be again reset.

The output means 55 includes multiplexers that route various internal signals to output terminals TOK, FWD, FRN and RRN shown in FIG. 1. The multiplexer operation is controlled by a TESTN signal shown in FIG. 1 and the lower 4 bits of the signal N<8:1>N shown in FIG. 1. When the signal TESTN is asserted, applying the lower 4 bits of the N<8:1>N signal as shown in FIGS. 10A and 10B causes the internal signals identified in these figures to be applied to the noted outputs.

A preferred embodiment of the present invention is embodied in a CHAY800 gate array manufactured by California Devices Inc., Milpilas, Calif. The CHA4800 gate array includes 4800 CMOS gates (19200 CMOS transistors). The gates are fabricated in silicon gate, oxide-isolated, 2 um double metal CMOS. It will, of course, be recognized by those skilled in the art that the operations/processing described herein can easily be implemented in a microprocessor. It is not intended to limit the present invention to the embodiments described, instead the scope of the present invention is defined by the following claims.

What is claimed is:

1. A programmable system connectable to receive pulses representing a pattern on a rotatable disk comprising:
    pulse receiving means for receiving the pulses, for detecting a direction of rotation of the disk and for providing motion signals in dependence upon said detecting;
    register means for receiving control parameters, for storing said parameters and for providing a plurality of parameter outputs responsive to said control parameters;
    ratio means for receiving said motion signals and for providing ratio signals responsive to said motion signals and to a ratio of a first group of said parameter outputs to a second group of said parameter outputs; and
    output means for providing output drive signals responsive to said ratio signals and in accordance with a third group of said parameter outputs and said direction of rotation detected by said pulse receiving means.

2. A programmable system according to claim 1, wherein said ratio means comprises:
    multiplier means for multiplying said motion signals in accordance with said first group of said parameter outputs and for providing multiplier signals being responsive to said multiplication; and
    divider means for dividing said multiplier signals in accordance with said second group of said parameter outputs and for providing said ratio signals being responsive to said division.

3. A programmable system according to claim 1 operatively connectable to a non-volatile memory, wherein said register means includes:
    initialization means, operatively connected to receive a program input and a mode input, for programming the non-volatile memory to store said control parameters in response to said program input and for providing, in accordance with said mode input, one of said received control parameters and said control parameter stored in the non-volatile memory as said parameter outputs.

4. A programmable system according to claim 1, wherein said output means comprises:
    means for storing said ratio signals and for generating forward and reverse output drive signals based on said ratio signals and said direction of rotation detected by said pulse receiving means; and
    limiting means for limiting said generation of said forward and reverse output drive signals to a predetermined level in accordance with said third group of parameter outputs.

5. A programmable system according to claim 1 further comprising:
    clock sequencer means, operatively connected to receive a reset signal, for synchronizing operation of said programmable system, for providing a signal to reset said programmable system in response to said received reset signal, and for providing a direction output based on said direction detected by said pulse receiving means.

6. A programmable system according to claim 5 further comprising:
    output terminals;
    test means, operatively connected to receive a test input signal, for testing operation of said programmable system in response to said test input signal and in accordance with a portion of said first group of parameter outputs, and for multiplexing tested signals to some of said output terminals in accordance with said portion of said control first group of parameter outputs.

* * * * *